United States Patent [19]
Tolbert

[11] Patent Number: 5,122,893
[45] Date of Patent: Jun. 16, 1992

[54] BI-DIRECTIONAL OPTICAL TRANSCEIVER

[75] Inventor: Cloys G. Tolbert, Houston, Tex.

[73] Assignee: Compaq Computer Corporation, Houston, Tex.

[21] Appl. No.: 633,219

[22] Filed: Dec. 20, 1990

[51] Int. Cl.⁵ .......................................... H04B 10/00
[52] U.S. Cl. ............................................. 359/152
[58] Field of Search ................ 455/606, 607, 613; 250/316.1; 359/152, 154

[56] References Cited

U.S. PATENT DOCUMENTS

| | | | |
|---|---|---|---|
| 4,213,394 | 7/1980 | Brenner | 250/316.1 |
| 4,633,522 | 12/1986 | Yamamoto et al. | 455/606 |
| 4,648,131 | 3/1987 | Kawaguchi | 455/606 |
| 4,717,913 | 1/1988 | Elger | 455/613 |
| 4,727,600 | 2/1988 | Avakian | 455/607 |
| 4,885,804 | 12/1989 | Mayle | 455/606 |
| 4,941,205 | 7/1990 | Horst et al. | 455/606 |
| 4,957,348 | 9/1990 | May | 455/606 |

FOREIGN PATENT DOCUMENTS

| | | | |
|---|---|---|---|
| 0053742 | 6/1982 | European Pat. Off. | 455/606 |
| 0095741 | 6/1984 | Japan | 455/606 |
| 0265827 | 11/1987 | Japan | 455/606 |
| 0016035 | 1/1989 | Japan | 455/606 |

OTHER PUBLICATIONS

Hewlett-Packard, Hewlett-Packard Optoelectronics Designers Catalogue 1988/89.

Primary Examiner—Edward L. Coles, Sr.
Assistant Examiner—Kinfe-Michael Negash
Attorney, Agent, or Firm—Pravel, Gambrell, Hewitt, Kimball & Krieger

[57] ABSTRACT

A bi-directional optical transceiver which provides bi-directional translation between optical and electrical signals. The transceiver includes an LED, a photodiode, and a transimpedance preamplifier which are mounted onto a single base to provide the bi-directional translation. The photodiode receives optical signals and, in conjunction with the preamplifier, produces corresponding electrical signals, and the LED receives electrical signals and produces corresponding optical signals.

6 Claims, 4 Drawing Sheets

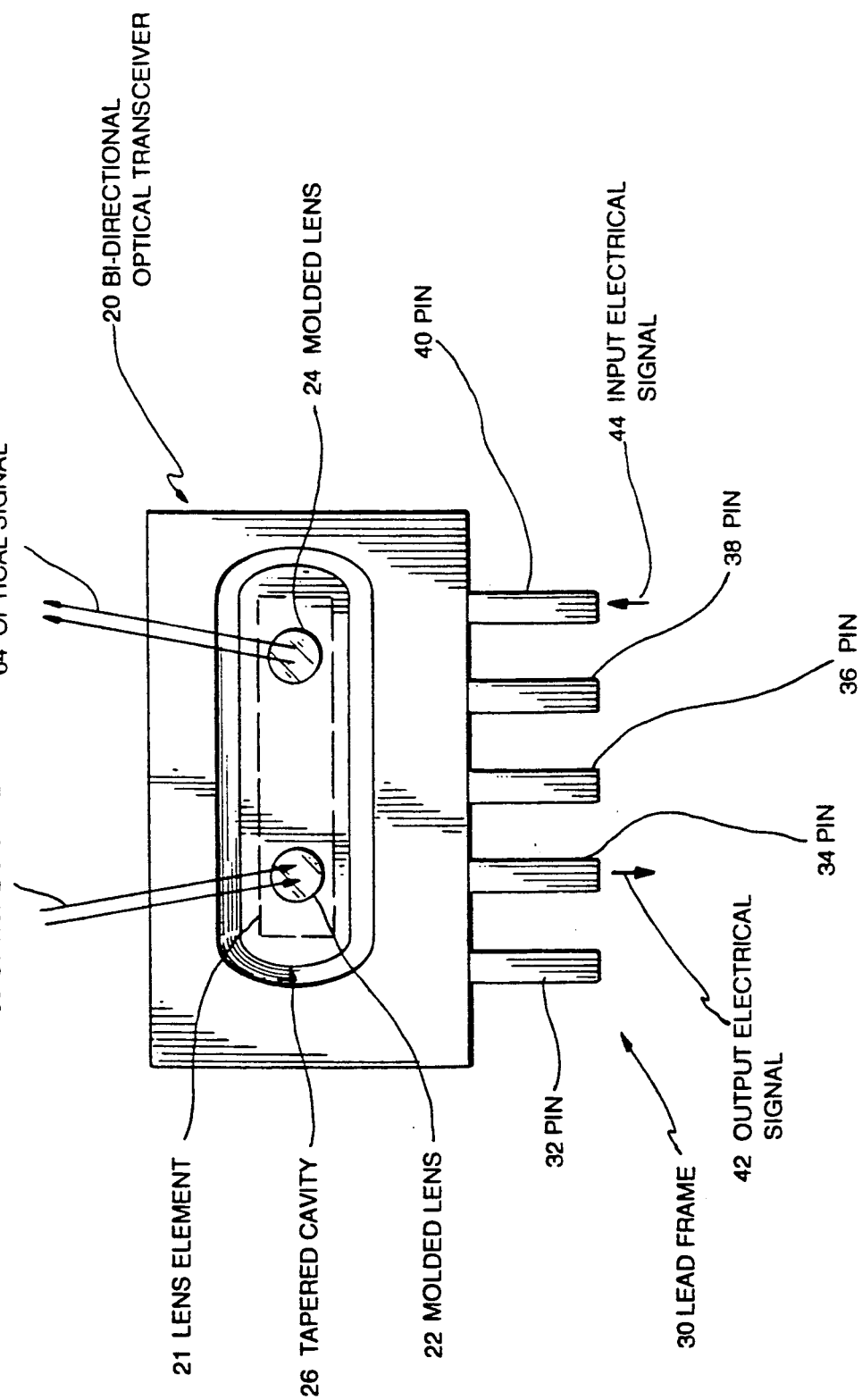

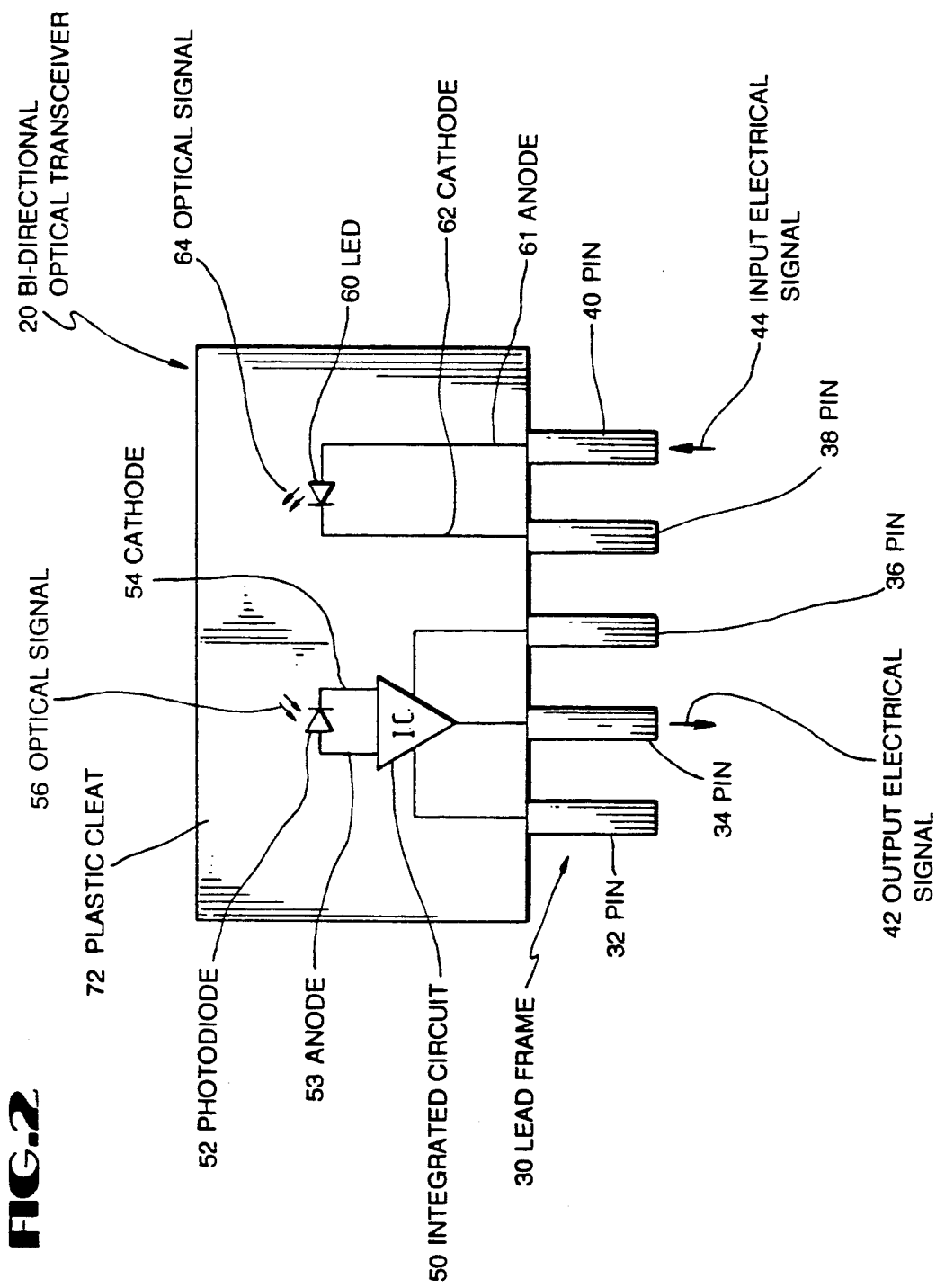

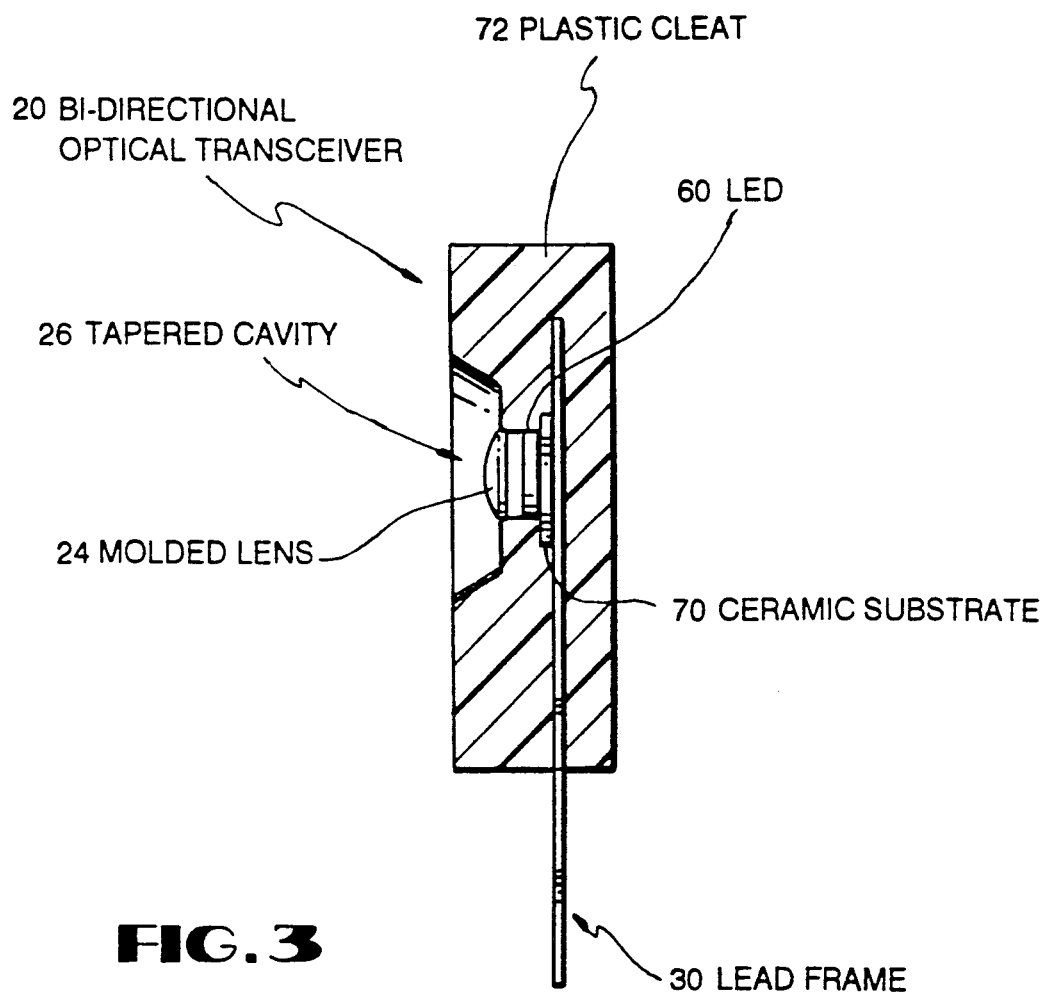

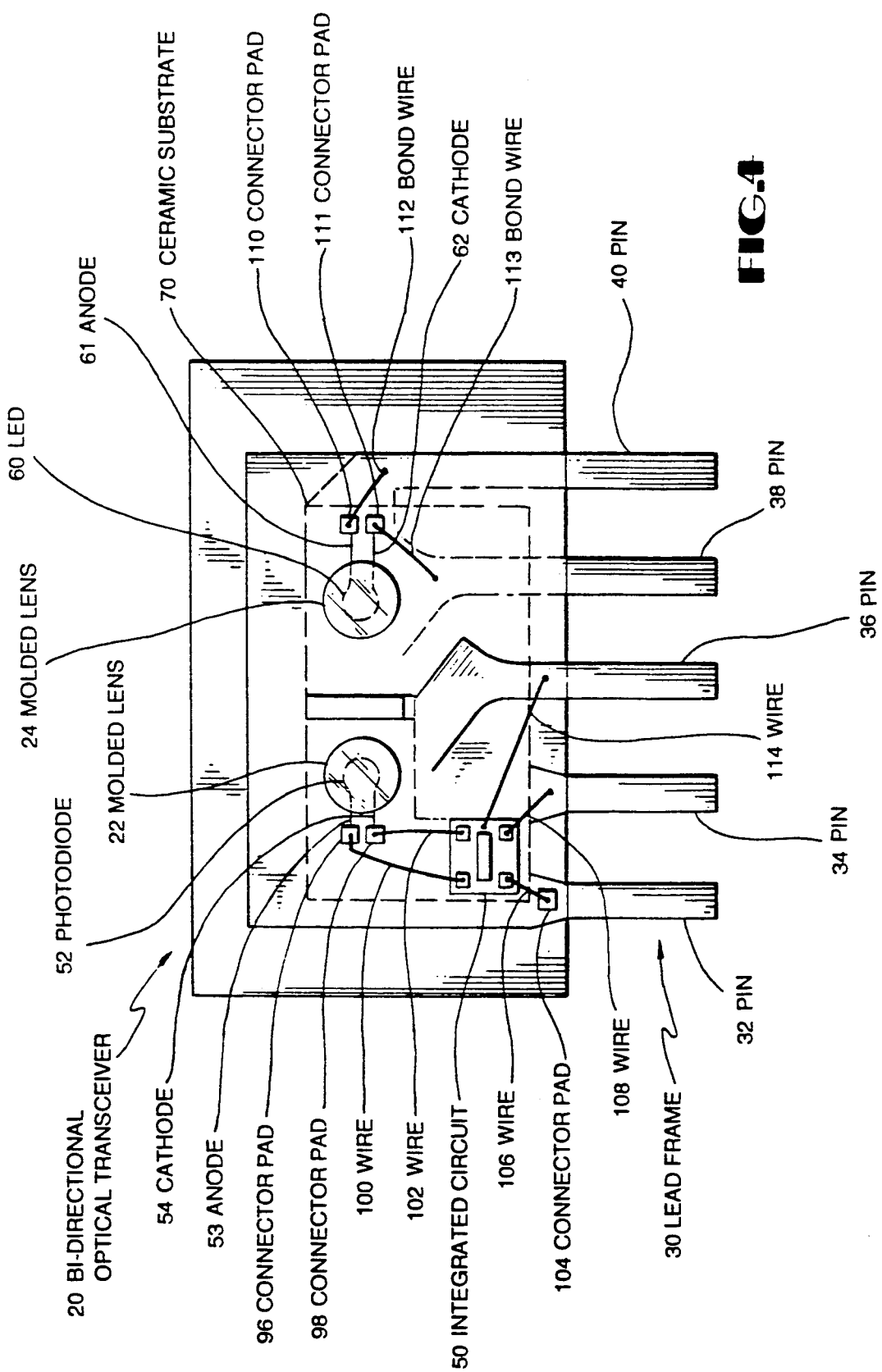

BI-DIRECTIONAL OPTICAL TRANSCEIVER

BACKGROUND OF THE INVENTION

1. Field of the Invention

The present invention relates to optical and electrical communication, and more specifically to the incorporation of a photodiode and a light emitting diode (LED) on a single base to provide bi-directional translation capabilities between optical and electrical signals.

2. Description of the Prior Art

Optical communication has become an increasingly important field. With the introduction of fiber optic communication, optical communication based on light is replacing electricity in some systems as a means of communication. However, the optical signals must still be converted to or from electrical signals for use in the system. In these systems, it is desirable that the system be able to transform optical signals into corresponding electrical signals and electrical signals into corresponding optical signals to enable the electrical and optical portions of the system to interface properly.

A principal device used in transforming optical signals into electrical signals is the photodiode. A photodiode is comprised of a reverse biased P-N junction. When a photodiode is illuminated with light, it produces current which varies almost linearly with the light flux. A device that is commonly used to transform electrical signals into optical signals is a light-emitting diode or LED. An LED receives an electrical signal and generates a corresponding optical or light signal that varies with the electrical signal.

The above devices are generally incorporated into systems which include both electrical and optical signals to provide a means for translating between the electrical and optical signals. However, the incorporation of these separate devices into systems unduly increases the size of these systems. Therefore, it is desirable to provide a single apparatus which provides bi-directional translation capabilities between electrical signals and optical signals to enable the electrical and optical portions of a system to be able to interface properly.

SUMMARY OF THE INVENTION

The present invention comprises a photodiode, a transimpedance preamplifier, and a light emitting diode (LED) mounted on a single base to provide bi-directional translation capabilities between electrical and optical signals in a system. The photodiode and preamplifier are coupled together to receive optical or light signals and generate corresponding electrical signals. The LED receives electrical signals and generates corresponding light or optical signals. A plurality of electrical pins are used to transmit and receive electrical signals to connect the preamplifier and LED to the electrical portion of the system, and one lens element having two lens portions is used to transmit and receive optical signals to interface to the optical portion of the system.

BRIEF DESCRIPTION OF THE DRAWINGS

A better understanding of the present invention can be obtained when the following detailed description of the preferred embodiment is considered in conjunction with the following drawings, in which:

FIG. 1 is a front view of a bi-directional optical transceiver according to the present invention;

FIG. 2 is a schematic drawing of the optical transceiver of FIG. 1;

FIG. 3 is a side view in partial cross section of the optical transceiver of FIG. 1; and FIG. 4 is a detailed internal view of the optical transceiver of FIG. 1.

DESCRIPTION OF THE PREFERRED EMBODIMENT

Referring now to FIG. 1, a bi-directional optical transceiver 20 according to the present invention is shown. The bi-directional optical transceiver 20 is preferably incorporated into a system having electrical and optical portions where an interface is required between electrical signals and optical signals developed by the respective portions. The electrical portion of the system is preferably capable of developing and receiving electrical signals, and the optical portion of the system is preferably capable of developing and receiving optical signals.

The bi-directional optical transceiver 20 includes a lens element 21 having a molded lens 22 for receiving optical signals 56 from the optical portion of the system and a molded lens 24 for transmitting optical signals 64 to the optical portion of the system. The lens element 21 is set into a tapered cavity 26. The optical transceiver 20 also includes a lead frame 30 having five pins 32, 34, 36, 38 and 40 that connect with the electrical portion of the system. The pin 32 is preferably connected to a high voltage supply, referred to as +VCC. The pin 34 preferably provides an output electrical signal 42 to the electrical portion of the system that has been developed based on the optical signal received through the molded lens 22. The pins 36 and 38 are preferably connected to ground. The pin 40 preferably receives an input electrical signal 44 from the electrical portion of the system that is converted into an optical signal 64 which is output through the molded lens 24 to the optical portion of the system. In an alternate embodiment of the invention, the pin 38 is connected to the collector of a transistor in the electrical portion of the system (not shown) and the pin 40 is connected to a +VCC voltage supply. Since this type of LED configuration is well known to those skilled in the art, details of its implementation are omitted for simplicity. The components comprising the optical transceiver 20 are preferably housed in a single unit comprised of an injection molded plastic cleat 72 (FIG. 3), or some other type of packaging material. The components may also be mounted into a "TIL" pill package or other suitable container, i.e. TO5, dip, etc.

Referring now to FIG. 2, the internal components comprising the bi-directional optical transceiver 20 are shown schematically. The optical transceiver 20 includes an integrated circuit 50 and a photodiode 52 whose anode 53 and cathode 54 are preferably connected to connections of the integrated circuit 50 so that the photodiode 52 is reverse biased. The photodiode 52 is preferably placed behind the molded lens 22 (FIG. 1) so that it can receive the optical signals 56 from the optical portion of the system, preferably from a fiber optic cable. The photodiode 52 operates such that when the optical or light signal 56 from the optical portion of the system is radiated onto its P-N junction, it generates an electrical signal out of its cathode 54 that depends on the quantity of light 56 radiated. This electrical signal is provided to an input of the integrated circuit 50. It will be appreciated that other elements such as a phototransistor may be substituted in place of the photodiode 52 to receive optical signals from the optical portion of the system.

The integrated circuit 50 is preferably a transimpedance preamplifier according to the preferred embodiment. However, the use of various other types of amplifiers is also contemplated. The integrated circuit 50 is preferably connected to each of the pins 32, 34 and 36. The integrated circuit 50 is connected to ground through the pin 36 and receives a +VCC voltage from the pin 32. The integrated circuit 50 produces an electrical signal 42 that is output from the pin 34 and is provided to the electrical portion of the system. The integrated circuit 50 preferably amplifies the current from the photodiode 52 and generates a corresponding electrical signal 42 on the output pin 34. Therefore, the electrical signal 42 output on the pin 34 and provided to the electrical portion of the system varies with the magnitude of the optical or light signal 56 radiated on the photodiode 52 from the optical portion of the system.

The bi-directional optical transceiver 20 further includes a light emitting diode (LED) 60 whose anode 61 is connected to the pin 40 and whose cathode 62 is connected to the pin 38. The LED 60 receives a current signal 44 from the electrical portion of the system through the pin 40 and generates the corresponding light or optical signal 64 that is provided to the optical portion of the system. The LED 60 is preferably placed behind the molded lens 24 (FIG. 1) to allow the optical signal 64 generated by the LED 60 to be output through the molded lens 24. The optical signal 64 is preferably provided to a fiber optic cable or any other type of optical signal conductor in the optical portion of the system.

Referring now to FIG. 3, a side view of the bi-directional optical transceiver 20 is shown. The optical transceiver 20 includes a ceramic substrate 70 connected to the lead frame 30. The LED 60 is mounted on the ceramic substrate 70. The integrated circuit 50 and photodiode 52 are also mounted on the ceramic substrate 70. The ceramic substrate 70 facilitates the packaging of the LED 60, the integrated circuit 50, the photodiode 52, and the lead frame 30 into a single unit. The molded lens 24 is preferably situated normal to, centered with, and adjacent to the LED 60, and it operates to focus the light or optical signal 64 generated by the LED onto the fiber optic cable or other optical conductor (not shown) in the optical portion of the system. Although not shown in FIG. 3, the molded lens 22 is preferably similarly situated normal to, centered with, and adjacent to the photodiode 52 to focus the optical signal 56 received from the optical portion of the system onto the photodiode 52. The molded lenses 24 and 26 are situated in a tapered cavity 26 to facilitate the generation and reception of the optical signals 64 and 56, respectively.

Referring now to FIG. 4, a detailed internal view of the bi-directional optical transceiver 20 is generally shown. The preamplifier 50, the photodiode 52, and the LED 60 are mounted onto the ceramic substrate 70, which in turn is mounted onto the lead frame 30. Therefore, the ceramic substrate 70 enables the various components comprising the bi-directional optical transceiver to be mounted onto a single base.

The anode 53 and cathode 54 of the photodiode 52 include connector pads 96 and 98 that are mounted onto the ceramic substrate 70. The connector pads 96 and 98 are connected to pads on the integrated circuit 50 through wires 100 and 102, respectively, which are routed around the ceramic substrate 70. The input pin 32 receives the +VCC voltage supply from the system and provides this voltage through a connector pad 104 and wire 106 to a pad of the integrated circuit 50. The integrated circuit 50 develops the output electrical signal 42 that is provided through a wire 108 to the output pin 34. A ground input of the integrated circuit 50 is connected through a wire 114 to the pin 36, which is preferably grounded. The anode 61 and cathode 62 of the LED 60 are connected to respective connector pads 110 and 111 mounted on the ceramic substrate 70. Bond wires 112 and 113 are provided to connect the anode 61 and cathode 62 to the respective pins 40 and 38.

Therefore, the preferred embodiment of the present invention comprises a bi-directional optical transceiver which is capable of performing bi-directional optical transmission. The transceiver comprises an LED, photodiode, and transimpedance preamplifier which are mounted onto a single base and are used for bi-directional optical and electrical communication. The photodiode and preamplifier are coupled together to receive optical signals and generate corresponding electrical signals, and the LED receives electrical signals and generates corresponding optical signals. The incorporation of an optical signal receiver and transmitter into a single unit allows for reduced size and therefore provides for more convenient operation with fiber optic cable.

The foregoing disclosure and description of the invention are illustrative and explanatory thereof, and various changes in the size, shape, materials, components, circuit elements, wiring connections and contacts, as well as in the details of the illustrated circuitry and construction and method of operation, may be made without departing from the spirit of the invention.

I claim:

1. A bi-directional optical transceiver, comprising:
   a single, generally planar base means comprised of a ceramic substrate;
   means mounted on said base means for receiving a first electrical signal and for producing a corresponding first optical signal;
   means mounted on said base means adjacent said first electrical signal receiving and first optical signal producing means for receiving a second optical signal and for producing a corresponding second electrical signal;
   a housing containing said base means, said first electrical signal receiving and first optical signal producing means, and said second optical signal receiving and second electrical signal producing means, said housing including a cavity located over said base means and having tapered sides;
   a lens element set into said housing cavity having a first lens located adjacent said first electrical signal receiving and first optical signal producing means which receives said first optical signal from said first electrical signal receiving and first optical signal producing means and transmits said first optical signal and a second lens located adjacent said second optical signal receiving and second electrical signal producing means which receives said second optical signal and provides said second optical signal to said second optical signal receiving and second electrical signal producing means.

2. The bi-directional optical transceiver of claim 1, further comprising:
  a lead frame connected to said base means having a first pin which receives said first electrical signal and provides said first electrical signal to said first electrical signal receiving and first optical signal producing means and a second pin which receives said second electrical signal from said second optical signal receiving and second electrical signal producing means and transmits said second electrical signal.

3. The bi-directional optical transceiver of claim 2, the lead frame further including a third pin which is designated for connection to a voltage supply and a fourth pin designated for connection to a logical ground.

4. The bi-directional optical transceiver of claim 1, wherein said first electrical signal receiving and first optical signal producing means comprises a light emitting diode.

5. The bi-directional optical transceiver of claim 4, wherein said second optical signal receiving and second electrical signal producing means includes a photodiode.

6. The bi-directional optical transceiver of claim 5, wherein said second optical signal receiving and second electrical signal producing means further includes an amplifier means;
  wherein said photodiode receives said second optical signal and produces an electrical signal corresponding to the amount of said second optical signal received; and
  wherein said amplifier means receives said electrical signal from said photodiode and produces said second electrical signal in proportion to said electrical signal produced by said photodiode.

* * * * *